United States Patent
Jones et al.

(10) Patent No.: US 10,494,739 B2
(45) Date of Patent: Dec. 3, 2019

(54) LASER POLISHING CERAMIC MATERIAL

(71) Applicant: Apple Inc., Cupertino, CA (US)

(72) Inventors: Christopher D. Jones, Cupertino, CA (US); Matthew S. Rogers, Cupertino, CA (US); Dale N. Memering, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 718 days.

(21) Appl. No.: 14/812,914

(22) Filed: Jul. 29, 2015

(65) Prior Publication Data

US 2017/0029327 A1 Feb. 2, 2017

(51) Int. Cl.
*C30B 29/20* (2006.01)
*C30B 33/02* (2006.01)

(52) U.S. Cl.
CPC .............. *C30B 29/20* (2013.01); *C30B 33/02* (2013.01)

(58) Field of Classification Search
CPC .................... C30B 29/20; C30B 33/02
See application file for complete search history.

(56) References Cited

U.S. PATENT DOCUMENTS

| | | | | |
|---|---|---|---|---|
| 4,038,117 A | * | 7/1977 | Noble | C04B 41/009 216/76 |
| 4,731,516 A | * | 3/1988 | Noguchi | H01L 21/2026 219/121.66 |
| 6,479,104 B1 | * | 11/2002 | DiChiara, Jr. | C23C 24/08 106/690 |
| 8,546,172 B2 | * | 10/2013 | Meyer | B32B 37/02 257/E31.027 |
| 2006/0093834 A1 | * | 5/2006 | Lin | C30B 29/20 428/432 |

OTHER PUBLICATIONS

Ceramics in the Semiconductor Industry, published Jul. 30, 2000, https://www.ceramicindustry.com/articles/86378-ceramics-in-the-semiconductor-industry (Year: 2000).*

* cited by examiner

Primary Examiner — Jacob T Minskey
Assistant Examiner — Melody Tsui
(74) Attorney, Agent, or Firm — Dorsey & Whitney LLP

(57) ABSTRACT

Systems and methods for polishing a ceramic component using a laser. The ceramic component may include a planar region that is polished using, for example, a mechanical or chemical mechanical polishing operation to produce a polished face. A contoured region that is adjacent to the planar region may be irradiated using a laser to heat the ceramic material within the contoured region. The irradiation may reduce the surface roughness of the contoured region to produce a polished surface. The ceramic component may be heated prior to being irradiated with the laser to reduce thermal gradients within the ceramic component.

21 Claims, 6 Drawing Sheets

LASER POLISHING CERAMIC MATERIAL

FIELD

The described embodiments relate generally to ceramic materials and, more particularly, relate to systems and methods for polishing a ceramic material using a laser.

BACKGROUND

Corundum is a crystalline form of aluminum oxide and may be found in various colors, many of which are generally referred to as sapphire. In general, sapphire is a hard and strong material with a hardness of 9.0 on the Mohs scale, and, as such, is capable of scratching nearly all other minerals. Because of its hardness and strength, sapphire may be an attractive alternative to other translucent materials like polycarbonate. However, due in part to its inherent properties, manufacturing components out of sapphire may be difficult in high-volume manufacturing conditions. In particular, sapphire's hardness makes polishing the material both difficult and time consuming particularly if the component includes contoured surfaces or features.

SUMMARY

In general, high-temperature annealing may be used to polish a surface of a ceramic component made from materials including sapphire or zirconia. Localized high-temperature annealing may be performed using a laser process that is configured to promote movement and/or flow within the material along the surface of the component. The annealing may reduce the roughness and/or irregularities on the surface of the component and may also increase the strength of the component by removing micro-cracks or other surface defects. A laser-based, localized annealing process may be particularly useful for polishing a contoured feature or non-planar surface, particularly if the feature or surface is located within a flat sheet component that has already been polished.

Some example embodiments are directed to a method of polishing a sapphire component using a laser. A first region of the sapphire component may be heated to a first temperature using, for example, a furnace or first laser-based process. A second region, within the first region, may be irradiated using a second laser-based process. The laser may heat the second region to a second temperature that is greater than the first temperature. A surface of the sapphire component may be reflowed within the second region to reduce a surface roughness of the treated surface.

In some embodiments, heating the first region includes placing the sapphire component within a furnace and heating the furnace to heat the first region of the sapphire component to an elevated temperature. Before the first region cools below the first temperature, the second region may be irradiated using the laser.

In some embodiments, the heating the first region includes irradiating the first region using a first laser-based process that is different from the second laser-based process. The first laser-based process may heat the sapphire component to an elevated temperature and, before the first region cools below the first temperature, the second region may be irradiated using the second laser-based process.

In some implementations, the first temperature is less than an annealing temperature of the sapphire component. In some implementations, the second temperature is greater than a melting temperature of the sapphire component. The first temperature may, in some cases, be less than 1400 degrees Celsius, and the second temperature may be, in some cases, greater than 1500 degrees Celsius.

In some embodiments, the sapphire component is formed from a single-crystal structure. The second region may include a discontinuity in the single-crystal structure. The irradiating the second region may realign the single-crystal structure to repair the discontinuity.

Some example embodiments are directed to a method of polishing a non-planar surface of a sapphire component. The non-planar surface may be irradiated using a laser, which may cause a reflowing of at least a portion of the non-planar surface to produce a polished region within the non-planar surface. In some embodiments, the non-planar surface forms at least part of a groove recessed into a planar surface of the sapphire component. In some embodiments, the non-planar surface forms a side wall of an opening formed in a planar surface of the sapphire component.

In some cases, a planar surface that is adjacent to the non-planar surface is polished using an abrasive polishing operation to produce a flat polished region. The polished region of the non-planar surface may be substantially matched to a surface finish of the flat polished region.

Some example embodiments are directed to method of polishing a sapphire component by polishing a planar region of the sapphire component to produce a polished face and irradiating a contoured region that is adjacent to the planar region using a laser to heat sapphire within the contoured region above a threshold temperature. Irradiating the contoured region may reduce a surface roughness of the contoured region. Irradiating the contoured region may, in some cases, not alter the surface finish of the polished face. In some cases, the threshold temperature is greater than 1500 degrees Celsius.

In some implementations, the planar region forms a portion of a cover sheet to be disposed above a display of a portable electronic device. The contoured region may include a recess formed in the planar region of the sapphire component. The contoured region may include an edge of an opening formed in the planar region of the sapphire component.

Polishing the planar region is performed using a mechanical polishing operation, a chemical mechanical polishing operation, or a combination of mechanical and chemical mechanical polishing operations.

Some example embodiments are directed to a method of polishing a sapphire component, including irradiating a surface of the sapphire component using a laser to form a first ablated region; irradiating the surface of the sapphire component using the laser to form a second ablated region proximate the first ablated region; and irradiating the surface of the sapphire component using the laser to form a third ablated region proximate the second ablated region. The first, second and third ablated regions may form part of a polished surface having a decreased roughness as compared to the surface before irradiation using the laser.

In some embodiments, the second ablated region is adjacent to or at least partially overlapping with the first ablated region, and the third ablated region is adjacent to or at least partially overlapping with the third ablated region. In some embodiments, forming the first, second, and third ablated regions removes surface discontinuities in the surface of the sapphire component. In some cases, polished surface is an edge of an opening formed in the sapphire component.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
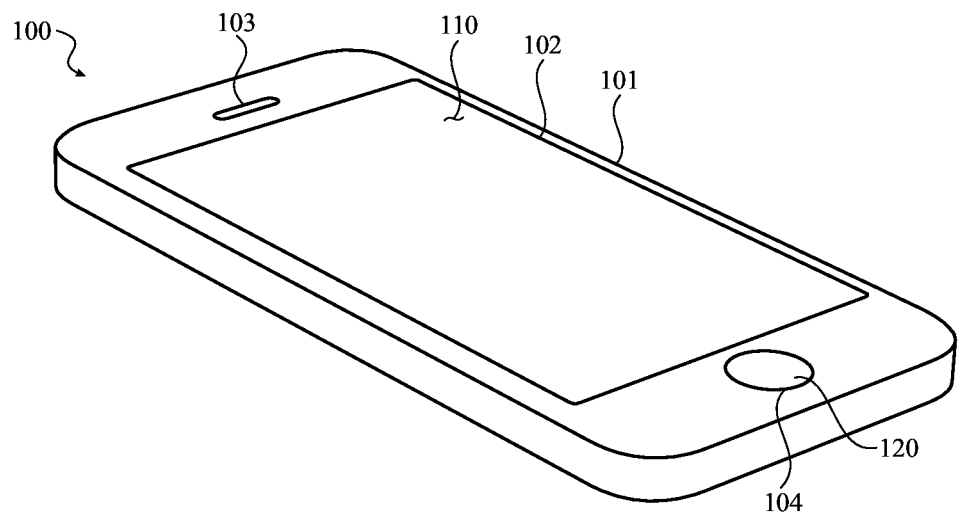
FIG. 1A depicts the front of an example electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to techniques for polishing a portion of a surface of a ceramic component. The ceramic component may be formed from a transparent ceramic material, such as sapphire, zirconia, or other similar material. Numerous consumer and non-consumer devices utilize protective coverings, windows, and/or surfaces formed from hard materials, including various transparent ceramic materials. Compared to other optically clear materials, such as polycarbonate, hard ceramic materials like sapphire offer improved scratch resistance and strength. However, as previously mentioned, sapphire may be difficult to polish using traditional techniques. In particular, portions of a sapphire component that have contoured, curved, or otherwise non-planar surfaces may be difficult to polish using abrasive polishing techniques.

As described with respect to embodiments herein, high-temperature annealing may be used to polish a surface of a ceramic component made from materials including sapphire or zirconia. Localized high-temperature annealing may promote movement and/or flow within the material near the surface, which may reduce the roughness and/or irregularities on the surface of the component while maintaining the structural integrity of the core or remainder of the component. For ceramics that are formed from a crystalline structure, a high-temperature annealing process may allow for realignment of the crystalline structure into a lower-energy state, which may improve the smoothness of the surface and/or increase the strength of the component by removing micro-cracks or other surface defects. Using a laser, high-temperature annealing may be well controlled over a localized region, which may be advantageous when polishing a contoured feature or non-planar surface, particularly if the feature or surface is located within a flat sheet component that has already been polished.

Some embodiments described herein are directed to using a laser to ablate or otherwise remove material to polish the surface of a component formed from a hard ceramic material. The laser ablation may create a localized pattern or mosaic of small ablated regions that together form a surface that is more smooth than an unpolished surface. The laser ablation may also remove micro-cracks or other surface defects by removing material close to the surface of the component.

Some embodiments described herein are directed to a localized high-temperature annealing processes which, as the name implies, may subject the component to temperatures that are higher than those that are used for a typical annealing process. In order to polish and/or remove defects on the surface of a ceramic component, it may be possible to heat the part to near or above the melting point of the ceramic material in order to reflow the surface of the component. By reflowing a localized region of the ceramic component, micro-cracks may be healed by or filled with molten or near-molten ceramic material. Generally, it may be difficult or impossible to heat the entire sapphire part to a temperature that approaches the melting point without adversely affecting or impacting the overall geometry and/or surface finish of the part. In particular, if a high-temperature thermal annealing were applied to the entire ceramic part for a sufficient time and temperature to polish edges, corners or other non-planar surfaces of a ceramic component (or repair surface defects), the annealing process may also produce distortion, visible irregularities, or other imperfections within flat planar areas of the ceramic component, which may be undesirable.

In some embodiments described herein, a localized region of the surface of a ceramic component may be polished using a laser-based annealing process. To reduce thermally induced stress, the laser-based process may be controlled to minimize thermal gradients within the material. For example, the size of the heated region, the duration of the heating, the depth of the heating, and other similar factors may be controlled to reduce thermally induced stress as a result of the laser-based annealing process. In some implementations, short pulses of the laser are used to ablate or otherwise remove small portions of the ceramic component and polish the surface of the ceramic component while minimizing thermally induced stress. Additionally or alternatively, the component may be heated by a furnace or other laser-based process to reduce the thermal gradient between the polished region and other regions of the ceramic component.

These and other embodiments are discussed below with reference to FIGS. 1A-6. However, those skilled in the art will readily appreciate that the detailed description given herein with respect to these Figures is for explanatory purposes only and should not be construed as limiting.

Figure 1B:
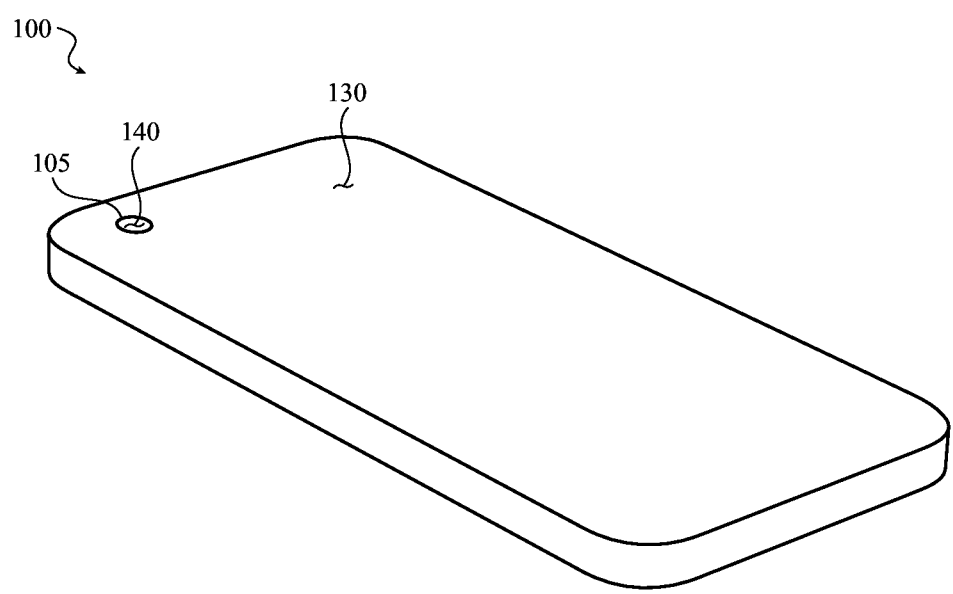
FIG. 1B depicts the rear of the example electronic device.

FIGS. 1A-1B depict an example electronic device having one or more ceramic components that are polished using laser-based polishing techniques described in more detail with respect to FIGS. 4-5, below. In particular, FIGS. 1A-1B depict a device having multiple protective sheets that are formed from a ceramic material, such as sapphire. While the following examples are provided with respect to protective sheets formed from a sapphire component, other ceramic materials may also be used, including, for example, various forms of glass, zirconia, and the like.

In the present example, the protective sheets are formed from one or more sapphire components, which may provide outstanding scratch resistance and enhance the mechanical integrity of the device. A protective sheet may also function as an optically transmissive window and provide visibility to underlying components, such as displays or graphical elements. In many implementations, both the optical and mechanical properties of the protective sheets may be important to perception of quality and performance of the device. More specifically, it may be beneficial that all surfaces of the protective sheets be polished to a degree that is both high-quality and consistent across various features, whether they are planar or non-planar features of the protective sheet.

As shown in FIG. 1A, the device 100 includes a protective cover sheet 110 formed from a sapphire component and is used as an optically transmissive protective layer. The cover sheet 110 may be attached to an enclosure 101 of the device 100 using an optically transmissive adhesive or other bonding technique. In one example, the cover sheet 110 is attached to the enclosure 101 using a pressure sensitive adhesive (PSA) film. In some embodiments, a channel 112 (FIG. 2) may be machined or otherwise formed around the perimeter of the cover sheet 110 in which an adhesive may be introduced and used to bond the cover sheet 110 to the enclosure 101. The cover sheet 110 may also be attached to or otherwise disposed above the display 102, which may protect the display 102 from scratches or other physical damage.

As described in more detail below with respect to FIGS. 2 and 3A-C, the cover sheet 110 may include a combination of planar and non-planar or contoured features. It may be generally beneficial that all of the features of the cover sheet 110 have a polish or surface finish having a particular quality and consistency. Uniform surface finish or polish may enhance the quality and performance of the device. For example, uniform surface finish and/or polish over the cover sheet 110 may enhance the aesthetic qualities of the device 100 and also improve the strength by removing or reducing micro-cracks or other structural defects in the material.

The cover sheet 110, depicted in FIG. 1A, is formed from a sapphire component having an overall thickness of less than 3 mm in one example. In some embodiments, the overall thickness of the cover sheet 110 is between approximately 0.1 mm and 1 mm. Moreover, the cover sheet 110 may be formed into a variety of non-sheet shapes, including components that have multiple features of different thicknesses.

The cover 110 may be formed from a single sheet of sapphire material or, alternatively, be formed from a laminate material made from multiple layers and having at least one layer formed from a sheet of sapphire. In the present example, one side of the cover sheet 110 is printed with a solid, opaque border around a perimeter portion. The center portion of the cover sheet 110 remains optically transmissive and may be polished to a high surface finish.

The side of the cover sheet 110 that is external to the device may also be polished to a high surface finish and may also include an anti-reflective or other type of coating to enhance the optical properties of the cover sheet 110. Opposite to the exterior side of the cover sheet 110, an ink or paint may be applied to a perimeter portion that surrounds the center viewable portion of the cover sheet 110. In some implementations, the perimeter portion that is painted has a surface finish that is less polished than other portions of the cover sheet 110 in order to facilitate paint adhesion and/or bonding properties with other components of the device 100.

The enclosure 101 may define an opening in which the display 102 is positioned or disposed. The display 102 may include a liquid crystal display (LCD), organic LED display, or similar display element. Because the cover sheet 110 overlays the display 102, optical clarity and physical strength are important aspects of the cover sheet's functionality. The cover sheet 110 may also be attached to, or be integrated with, a transparent electronic sensor that overlays the display 102. In some cases, the electronic sensor covers the entire display 102 and is used as the main input device for the user. In some implementations, the cover sheet 110 may be integrated with a capacitive touch sensor used to detect finger or stylus touches on the surface of the cover sheet 110.

As shown in FIG. 1A, the front surface of the device 100 also includes a button sheet 120 used to protect the surface of the control button 104. In this example, the button sheet 120 is formed from a sapphire sheet and is used as an optically transmissive protective layer. The button sheet 120 protects the surface of the control button 104 and may have a high degree of polish to facilitate visibility of a graphical element or symbol printed on the control button 104. However, it is not necessary that the button sheet 120 be optically transmissive. For example, the button sheet 120 may be opaque and an outer surface of the button sheet 120 may have a surface finish configured to provide an appropriate aesthetic appearance or tactile quality. The button sheet 120 may be formed as a flat sheet or may be formed as or include a contoured or curved surface.

The button sheet 120 may enhance the mechanical strength of the control button 104, which is used as an input to the device 100. In the present example, the control button 104 includes a tactile switch which is operated by depressing the control button 104. The control button 104 may also include or be associated with an electronic touch sensor, such as a capacitive touch sensor or biometric sensor. The button sheet 120 may be attached directly to an actuator or housing of the control button 104 and may, alternatively, be attached to or integrated with the electronic touch sensor of the control button 104.

In certain embodiments, the button sheet 120 depicted in FIG. 1A is formed from a sapphire sheet having an overall thickness of less than 3 mm and, in some embodiments, between approximately 0.1 mm and 1 mm. Other thicknesses and dimensions are also envisioned. Similar to the cover sheet 110, the button sheet 120 may be formed from a single sheet of sapphire material or, alternatively, be formed from a laminate material having at least one layer formed from a sheet of sapphire. In some cases, the button sheet 120 is formed from the same material as the cover sheet 110, although this is not necessary. One or both sides of the button sheet 120 may also be printed or coated to enhance the optical properties of the sapphire component.

FIG. 1B depicts a back view of the device 100 having one or more protective covers formed from sapphire components. In this example, the back surface of the device 100 is covered by a back sheet 130. Similar to the cover sheet 110, the back sheet 130 is also formed from a sapphire component and is used as an optically transmissive protective layer. Also, similar to the cover sheet 110, the back sheet 130 may be formed from a single sheet of sapphire material or, alternatively, be formed from a laminate material having at least one layer formed from a sheet of sapphire. In this case, the back sheet 130 covers the entire back of the device 100, except for the area near the camera lens 105. A separate camera cover 140 may be used to protect the camera lens 105. The camera cover 140 may be formed as a flat sheet or as a contoured shape. The camera cover 140 may also be configured to function as an optical lens or other optical element. In an alternative embodiment, the back sheet 130 also covers the camera lens 105 and the separate camera cover 140 is not used.

Figure 2:
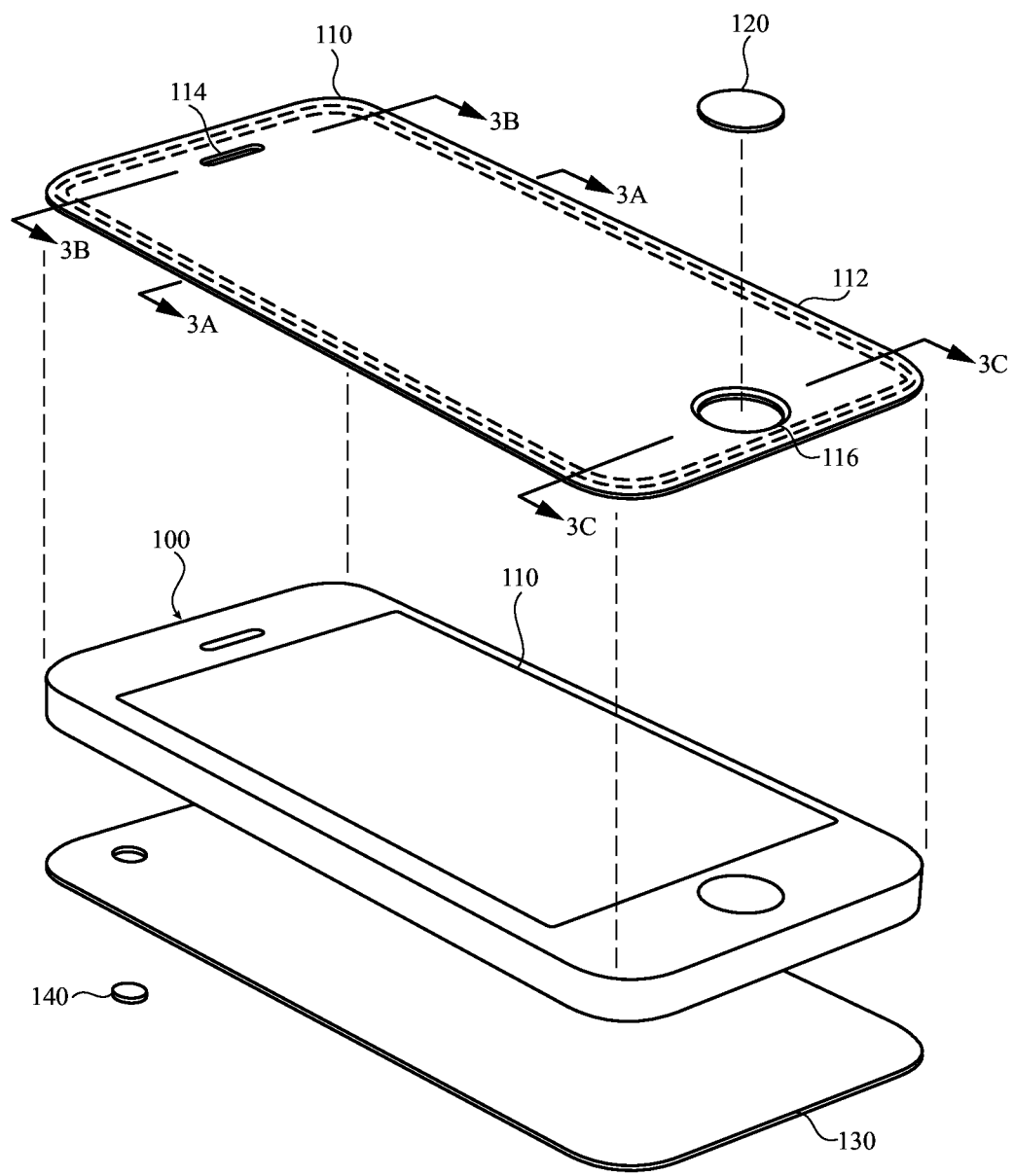
FIG. 2 depicts an exploded view of the example electronic device.

FIG. 2 depicts an exploded view of the example device 100 with the covers separated from the device. As shown in FIG. 2, the front of the device 100 is substantially covered by the cover sheet 110 and the button sheet 120. The back of the device 100 is substantially covered by the rear cover 130 and the camera cover 140. While this is provided by way of example, fewer or more cover sheets may be used to protect various aspects of the device 100.

As shown in FIG. 2, the cover sheet 110 includes a combination of planar and non-planar features that may be polished in accordance with the present disclosure. In particular, the cover sheet 110 includes two openings: a button opening 116 and a speaker opening 114. The button opening 116 is formed as a generally circular shape and is sized to receive the button and/or the button sheet 120. The speaker opening 114 is formed as an elongated or non-circular shape and is sized to allow sound to pass from an internal speaker 103 to the user's ear. While the button opening 116 and speaker opening 114 are shown as closed features, either or both of the openings may be formed as an open-sided shape, such as a u-shape, elongated notch, or the like.

Figure 3A:
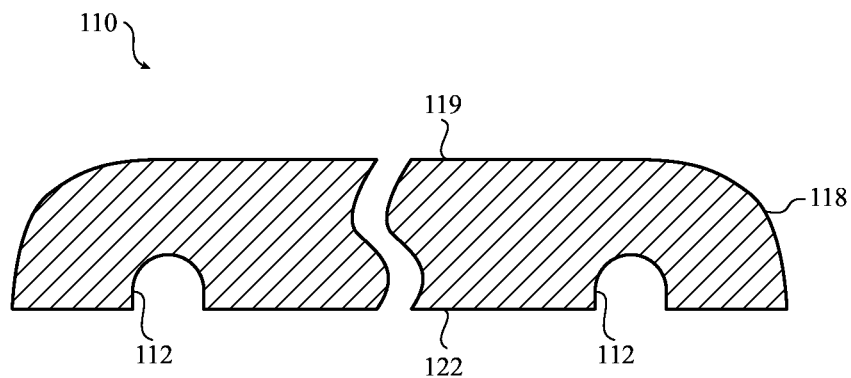
FIGS. 3A-3C depict various cross-sectional views of the cover sheet having different non-planar or contoured surfaces that may be polished using a laser.
Figure 3B:
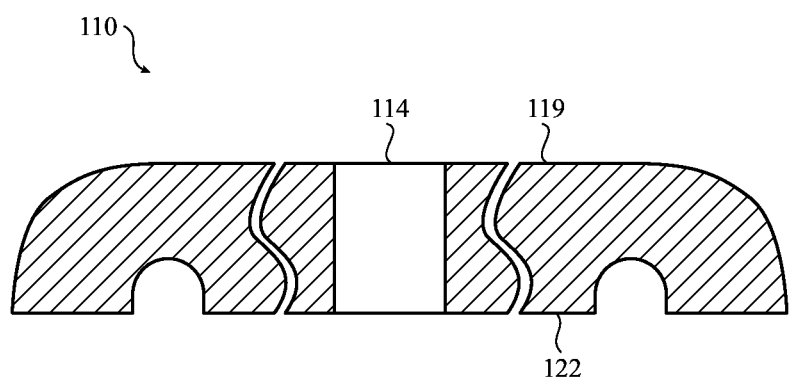
Figure 3C:
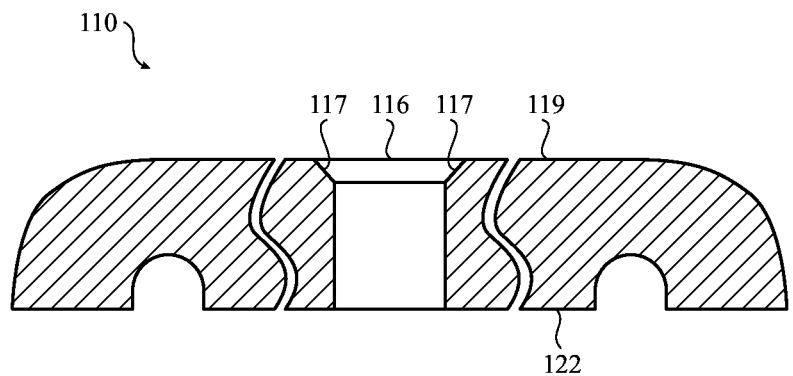

As shown in FIG. 2, the cover sheet 110 also includes a groove feature 112 recessed or otherwise formed in the lower surface (see 122 FIGS. 3A-3C). The groove feature 112 may be formed as a depression or recess that is traced along a closed path located near the outer perimeter of the cover sheet 110. The groove feature 112 may be used to hold adhesive used to bond the cover sheet 110 to the enclosure 101 of the electronic device 100. The groove feature 112 may also be sized to receive another component, such as a wire or electrical conduit. In some implementations, the groove feature 112 is sized to receive an electrical component, such as an antenna, used to conduct wireless communication between the electronic device 100 and a separate external device. The groove feature 112 may also be used to attach a decorative or cosmetic component to the device, such as a decorative band.

FIGS. 3A-3C depict various cross-sectional views of the cover sheet 110 depicted in FIG. 2. The examples of FIGS. 3A-3C depict various non-planar or contoured surfaces that may be polished using embodiments of the present disclosure. While the following examples are provided with respect to non-planar features located on the cover sheet 110, similar types of features may also be formed on the back sheet 130 or other ceramic components of the device.

FIG. 3A depicts a cross-sectional view of the cover sheet 110 taken along Section 3A-3A. In the depicted example, the cover sheet 110 includes a groove 112 recessed into a planar bottom surface 122. The groove 112 is formed as an open-section profile that extends along a path that is near the perimeter of the cover sheet 110. The groove 112 includes a contoured surface that forms a depression or recess within the bottom surface 122. As described in more detail below with respect to FIGS. 4 and 5, the contoured surface of the groove 112 may be polished using a laser-based polishing operation or process.

The contoured surface of the groove 112 may be surrounded by or otherwise formed within a substantially planar or flat bottom surface 122. The bottom surface 122 may be polished, for example, using a traditional abrasive-based polishing technique. The contoured surface of the groove 112 may, in some cases, be polished using a laser-based process to match or substantially match the surface finish and/or polish on the planar bottom surface 122, which may be polished using an abrasive polishing technique. In some implementations, the groove 112 is polished to produce a surface finish that is less polished than other portions of the cover sheet 110, such as the bottom surface 122. The reduced level of polish may be acceptable because, for example, the groove 112 may be formed in a location that is outside of the viewable area of the display 102 (FIG. 1A).

As shown in FIG. 3A, the cover sheet 110 also includes a contoured edge 118 formed around the perimeter of the cover sheet 110. In this example, the contoured edge 118 is formed as a rounded edge having a semi-circular shape. The contoured edge 118 could, in alternative embodiments, include a chamfer, edge, break, angled, or other flat feature formed into the edge of the sapphire component alone or in combination with a curved feature. The contoured edge 118 may also be formed using a laser-based polishing operation or process. Because the contoured edge 118 transitions into the front surface 119, the polish produced along the contoured edge 118 may substantially match or correspond to a polish formed on the planar front surface 119. In some embodiments, the planar front surface 119 is polished using an abrasive-based process and the non-planar, contoured edge 118 is locally polished using a laser-based polishing process.

FIG. 3B depicts a cross-sectional view of the cover sheet 110 taken along Section 3B-3B. In the depicted example, the cover sheet 110 includes an opening 114 extending through the thickness of the cover sheet 110. As discussed above with respect to FIG. 2, the opening 114 may be a speaker opening that is configured to pass sound between the device and a user's ear. As shown in FIG. 3B, the side walls of the opening 114 may be substantially straight and perpendicular to the top and/or bottom surfaces 119, 122.

Polishing the side walls of the opening 114 may be particularly challenging using some traditional abrasive-based techniques. In particular, it may be difficult to polish the side walls without distorting the shape of the opening 114 using an abrasive tool or slurry. Traditional polishing may be even more difficult due to the non-circular shape of the opening 114, which does not facilitate a reaming process using a traditional circular polishing tool. Thus, in some embodiments, it may be advantageous to polish the side walls of the opening 114 using a laser-based polishing process, as described below with respect to FIGS. 4-5. In some embodiments, the laser-based polishing process does not distort the geometry of the opening 114 and may also not distort or impact the optical properties of the planar surfaces 119, 122 that are adjacent to the opening 114.

FIG. 3C depicts a cross-sectional view of the cover sheet 110 taken along Section 3C-3C. In the depicted example, the cover sheet includes a button opening 116 extending through the thickness of the cover sheet 110. As discussed above with respect to FIG. 2, the button opening 116 may be sized to receive a button and/or a button cover 120. As shown in FIG. 3C, the side walls of the button opening 116 may be substantially straight and the edge of the button opening 116 may include a chamfer feature 117. In some embodiments, a laser-based polishing process may be used to polish the side walls of the button opening 116 and/or the chamfer feature 117 formed around the edge. In some embodiments, the laser-based polishing process does not distort the geometry of the button opening 116 and may also not distort or impact the optical properties of the planar surfaces 119, 122 that are adjacent to the button opening 116.

For each of the examples depicted in FIGS. 3A-3C the various features may be polished using different processes to substantially match each other. In particular, the non-planar surfaces (e.g., groove 112, contoured edge 118, opening 114, button opening 116, chamfer 117) may be polished using a laser-based process that is configured to match the degree of surface finish and/or polish of an abrasive mechanical and/or chemical mechanical polishing processes used to polish the planar surfaces 119, 122.

In some embodiments, the various features of FIGS. 3A-3C may each include a different degree of surface finish and/or polish. For example, the first and second planar surfaces 119, 122 may be highly polished, the contoured edge 118 may be moderately polished, and the groove 112 may be lightly polished or unpolished. The degree of surface finish and/or polish may correspond to the roughness of the surface, rather than the use of any particular polishing or machining process.

The features identified above are merely exemplary, and different parts may have different features. In some embodiments, features are consistent with boundaries between different surface finishes and/or polishes. In other words, any contiguous area of a certain surface finish may be considered a feature. Thus, a single plane may include multiple features if the plane has distinct areas of different surface finishes and/or degrees of polish.

In general, a localized annealing process may be used to improve the surface finish over a localized region of a ceramic component. In particular, a localized annealing using a laser-based process as described in more detail below with respect to the example processes of FIGS. 4 and 5, below, may be well suited for localized polishing of non-planar or otherwise contoured surfaces of the component. By controlling the amount of energy and residual heat that is produced by the laser-polishing process, the effect on the optical properties of an adjacent surface or feature may be minimized. This may be particularly beneficial for polishing non-planar regions of a cover sheet having large planar areas that may be polished to a high degree of surface finish before the non-planar surfaces or features are finished using a laser.

Figure 4:
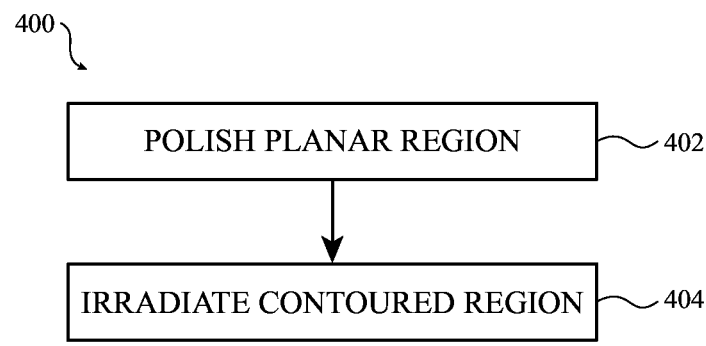
FIG. 4 depicts an example process for polishing a sapphire component.
Figure 5:
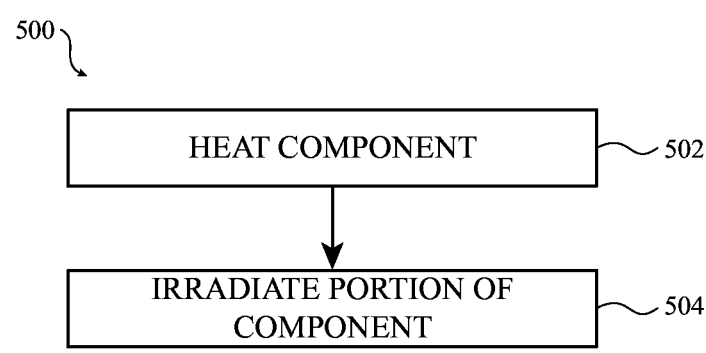
FIG. 5 depicts another example process for polishing a sapphire component.

FIGS. 4 and 5 depict exemplary processes 400, 500 that can be used to polish a localized region of a ceramic component. The polishing processes 400, 500 may be used to reduce surface roughness and/or improve the surface finish of non-planar or contoured surfaces on a ceramic component. In addition, the polishing processes 400, 500 may also strengthen and/or repair polished regions by removing or healing micro-cracks formed in the surface of the component.

In general, the processes 400, 500 may be implemented on, for example, the system 600 described below with respect the FIG. 6. Also, the sapphire component that is processed according to these processes may be used as a protective cover sheet on a device in accordance with the examples provided above with respect to FIGS. 1A-3C. The processes can also be used to produce a sapphire part used in a variety of other applications, including structural laminates, optical plates, optical lenses, and the like.

For purposes of the following description, a sapphire component is described as an example ceramic component. However, processes 400 and 500 may also be applied to other types of ceramics having various form factors. In the following examples, the sapphire component may include a sheet of sapphire material less than 3 mm thick and may be obtained from a variety of sources, natural and/or synthetic. As one non-limiting example, the sapphire component may be a sheet between approximately 1 mm in thickness cut from a cylindrical boule of sapphire material. In some cases, the sapphire component may be a laminate composite having multiple layers and at least one layer made from a sapphire material. Other layers in the sapphire laminate may include, for example, silicate glass, a polymer sheet, or additional layers of sapphire material.

FIG. 4 depicts a flow chart of operations for the example process 400 for polishing a sapphire component. The process 400 may be used to polish a region of a part such as the cover sheets 110, 120, 130, 140 described above, with respect to FIGS. 1A-3C. More specifically, the process 400 may be used to polish non-planar or contoured surfaces of a sapphire component, such as the groove 112, contoured edge 118, opening 114, button opening 116, and chamfer 117 described above with respect to FIGS. 3A-3C. Also, as described above, the non-planar surfaces may be adjacent to one or more planar surfaces, which may be polished using a different polishing operation.

In operation 402, a planar region of the component is polished. In some implementations, a planar region of a sapphire component is polished to produce a polished face. With respect to the examples provided above with respect to FIGS. 3A-3C. one or both of the top surface 119 and the bottom surface 122 may be polished using an abrasive polishing technique. In some implementations, operation 402 may include a mechanical polishing operation, a chemical mechanical polishing operation, or a combination of mechanical and chemical mechanical polishing operations. Example abrasive techniques may include use of a slurry liquid media having abrasive solids suspended within the slurry. For chemical mechanical polishing operations, the slurry may also include an etchant or other chemical compound, which may be used to soften or etch the material on the surface of the component. The abrasive slurry may be forced across the planar surface using a polishing pad or other polishing tool. The abrasive slurry may also be forced across the planar surface using a pressurized stream or other similar technique for moving fluid. In some embodiments of operation 402, a portion of the planar region may be polished using a laser-based polishing process. In particular, a laser polishing operation similar to as described below with respect to operation 404 may be used to polish a portion of the planar region.

Operation 402 may produce a highly polished face or surface that is suitable for use as a protective cover sheet for a display or other visual element. In particular, operation 402 may be used to produce an optically clear polished face or surface that is substantially free of surface scratches or other light-diffusing features that may detract from the appearance or clarity of the component. The polished face or surface of the planar region may have optical transparency and clarity sufficient for use as s cover sheet disposed above a high-resolution display of a portable electronic device.

In operation 404, a contoured region of the component is irradiated using a laser. The contoured region may be located adjacent to or proximate to the planar surface discussed above with respect to operation 402. The laser may be used to locally heat a portion of the contoured region to a threshold temperature that is greater than an annealing temperature of the ceramic. In some cases, the threshold temperature is at or near a melting temperature of the ceramic. In examples in which the ceramic includes a sapphire material, the threshold temperature may be greater than 1500 degrees Celsius.

The heating performed by the laser in operation 404 may cause a localized reflowing of the ceramic material which may reduce the surface roughness of the contoured region. In some examples, the laser irradiation causes micro peaks or surface features to flow into micro valleys or recesses in the surface of the part thereby reducing the overall surface roughness of the region. The reflowing of the material may be localized to the surface of the component, which may help to maintain the structural integrity of the component overall. That is, if the reflowed material is restricted to a localized region, the component is less likely to become distorted or warped as a result of the laser annealing/polishing.

In some instances, the ceramic component is formed from a single-crystal structure. For example, the ceramic component may be formed from a single crystal of synthetic sapphire material grown from a boule or bulk material. In cases where the ceramic material is formed from a crystalline material (single crystal or otherwise), discontinuities or breaks in the crystalline structure may occur near the surface of the ceramic component. In some implementations, the heating performed by the laser in operation 404 may cause material near the surface of the component to recrystallize and/or realign to repair or remove the discontinuities.

In some cases, operation 404 may create a surface finish and/or polish that is substantially matched to the surface finish and/or polish of the planar surface of operation 402. As previously discussed, it may be beneficial to provide a uniform surface finish or polish across the part, whether the surfaces are planar or non-planar in shape. Additionally or alternatively, operation 404 may strengthen the irradiated region by removing or healing micro-cracks, discontinuities, or other surface defects, which may impair the strength or fatigue life of the ceramic component.

In operation 404, the contoured region may include a non-planar surface formed into a surface of the sapphire component. With reference to FIGS. 3A-3C, the contoured region may include a recess or opening formed in a surface of the sapphire component. In particular, the contoured region may include a groove 112, speaker opening 114, button opening 116, or other similar feature formed into the cover sheet 110. The contoured region may also include an edge of an opening or edge of another feature formed in the sapphire component. In particular, the contoured region may include the chamfer 117, contoured edge 118, or other similar feature formed into the cover sheet 110.

While it may be desirable to heat the contoured region in operation 404 to reflow the material, it may be desirable to minimize or reduce the amount of heat that is produced in the polished face of the component formed above in operation 402. In particular, it may be desirable that the laser heating be localized to prevent degrading or otherwise altering the optical properties of the polished face of the component. Example optical properties that may be desirable to remain unaltered include surface finish, clarity, surface geometry (e.g., flatness), and so on.

The laser heating may be controlled by maintaining the laser parameters within ranges that reduce the conductance of heat from the contoured region to the planar region of the component. In some embodiments, the laser is configured to deliver a laser beam having a spot size that ranges between 0.1 mm² and 1 cm²; a wavelength that ranges between 200 nm to 10 μm; a pulse duration that ranges between a femto second to multiple microseconds; and a pulse repetition rate that ranges between 100 Hz and 500 KHz. The example ranges are provided as illustrative examples and are not intended to be limiting in nature.

In another embodiment of operation 404, the ceramic component is irradiated with a laser to ablate regions of the surface to form a polished surface. In particular, small regions or areas of the surface of the ceramic component may be ablated to remove micro-cracks, micro-peaks, surface discontinuities, or other surface roughening features. The small regions or areas may be ablated in locations that are adjacent or at least partially overlapping to form a substantially continuous polished surface. The polished surface may have a decreased roughness as compared to the surface before irradiation using the laser.

In some embodiments, the surface of the ceramic component is irradiated using a laser to ablate the surface and form a first ablated region. The surface of the ceramic component may then be irradiated using the laser to form a second ablated region that is proximate to the first ablated region. For example, the second ablated region may be adjacent to or partially overlapping with the first ablated region. The surface may also be irradiated to form a third ablated region that is proximate to (e.g., adjacent to, or at least partially overlapping with) the second ablated region. Similarly, multiple subsequent ablated regions may be formed that are proximate to other ablated regions to form a substantially continuous surface. The surface formed by the first, second and third ablated regions may form a polished surface having a decreased roughness as compared to an un-ablated or un-irradiated surface.

In order to perform the laser ablation in this embodiment of operation 404, the laser may be configured to deliver a laser beam having a spot size that ranges between 0.1 mm and 1 cm²; a wavelength that ranges between 200 nm to 10 μm; a pulse duration that ranges between femtosecond to multiple microseconds; and a pulse repetition rate that ranges between 100 Hz and 500 KHz. The example ranges are provided as illustrative examples and are not intended to be limiting in nature.

Although process 400 describes the planar region polishing operation 402 before the non-planar or contoured region polishing operation 404, the order is not intended to be limiting. That is, the order of operations 402 and 404 may be varied such that the laser-polishing operation 404 is performed before the planar region polishing operation 402. Additionally, the operations of process 400 may be combined with other steps or operations to achieve a final polished ceramic component.

In some embodiments, laser polishing operations may generate heat that results in a thermal gradient within the ceramic component. In some cases, the thermal gradient may be large enough that thermal stress may develop within the ceramic component, which may increase the risk of fracture, occurrence of slip lines, or the formation of other types of defects. Components that have larger polished areas and/or require a more extensive amount of reflowing on the surface of the component may be more vulnerable to thermal stress.

To reduce internal thermally induced stress, at least a portion of the ceramic component near a region to be polished may be heated to an elevated temperature prior to and during a laser polishing operation. The elevated temperature may reduce the thermal gradient within the component and reduce the risk of forming defects within the component due to the laser polishing operation. While heating a portion of the ceramic component may reduce the thermal gradient, it may not be necessary for every laser-polishing process.

FIG. 5 depicts an example process 500 that may be used to reduce thermal gradients during a laser polishing operation. The example process 500 refers generally to operations performed on a ceramic component, which may include the sapphire component examples described with respect to various embodiments herein. In particular, the process 500 may be used to polish a region of a part such as the cover sheets 110, 120, 130, 140 described above, with respect to FIGS. 1A-3C. Process 500 may be used to polish non-planar or contoured surfaces of a sapphire component, such as the groove 112, contoured edge 118, opening 114, button opening 116, and chamfer 117 described above with respect to FIGS. 3A-3C. Also, as described above, the non-planar surfaces may be adjacent to one or more planar surfaces, which may be polished using a different polishing operation.

Process 500 may be beneficial when polishing a feature or surface may result in a thermal gradient within the component that is likely to produce a thermally induced fracture or other type of defect. Process 500 may also be used to reduce the amount of heat energy that is produced by the polishing laser in order to reflow and/or polish the surface of the component. That is, by elevating the temperature of a region of the component near the area being polished, the polishing laser may be able to polish the area using a reduced amount of additional thermal energy as compared to a laser-polishing process performed on a part having an ambient or reduced temperature.

In operation 502, the ceramic component is heated to a first or elevated temperature. In some implementations, a first region of the ceramic component is heated to the first or elevated temperature using either a localized heating process and/or a heating process that affects the entire ceramic component. For example, the first region may be heated using a laser-based process that heats a localized region of the ceramic component. The laser-based process may include irradiation the first region of the ceramic component with a laser beam that may be moved through a raster or other type of pattern to heat an area that is larger than the beam size of the laser.

The first region may also be heated using a generalized or non-localized heating process, including a heating process that utilizes a furnace, heat chamber or other similar heating device to elevate the temperature of an internal volume or space in which the ceramic component is placed. The furnace or other heating device may heat the ceramic component to a substantially uniform temperature, such that the internal temperature of all or substantially all of the ceramic component is at or near the same temperature.

With regard to operation 502, the heating may be performed using one of a variety of heating and/or cooling profile(s). For example, the ceramic component may be heated from an ambient temperature (e.g., a room temperature) to the first temperature using a controlled heating rate. In some implementations, the heating rate may include one or more dwells at an intermediate temperature to reduce thermal gradients within the ceramic component. In some implementations, the ceramic component may be heated from an ambient temperature to an elevated temperature above the first temperature, and then allowed to cool to the first temperature. For example, if the ceramic component is heated using a furnace or other heating device, the ceramic component may be heated to a temperature higher than the first temperature and then removed from the furnace and allowed to cool slightly to the first temperature.

With respect to operation 502, the first or elevated temperature may correspond to an internal temperature that will not (or is predicted to not) result in damage or other undesirable thermal effect on the ceramic component. The temperature may reduce the chance of a thermal impact to the strength, surface finish/polish, geometry, crystalline structure, or other property of the ceramic component. In many cases, the temperature is below a point that is likely to cause warping or other types of distortion of the component. While the specific first or elevated temperature may vary depending on the type of ceramic material and the geometry of the component, for sapphire components having a cover sheet or similar geometry, the particular temperature may fall within a range of 1000 degrees Celsius and 1400 degrees Celsius. In some implementations, the first or elevated temperature is any temperature above ambient temperature and below the annealing temperature of the ceramic component. The first or elevated temperature may be above ambient temperature and below a temperature that corresponds to the brittle-ductile transformation of the ceramic material. These temperatures are provided merely as examples and are not intended to be limiting in nature.

With respect to operation 502, the first or elevated temperature may be selected based on the lowest threshold temperature among various features or geometries of the component. With reference to FIGS. 3A-3C, threshold temperatures for features 112, 114, 116, 117, or 118 may vary based on the specific geometry of the respective feature. The particular temperature may be below the minimum threshold temperature to reduce the risk of thermal impact to the respective feature or geometry. Again, with reference to FIGS. 3A-3C, if the threshold temperatures for features 112, 114, 116, 117, or 118 are 1000, 1500, 1500, 1400, and 1800 degrees Celsius, respectively, then the elevated temperature to which the component may be heated may be selected to be less than 1000 degrees Celsius.

In operation 504, a portion of the ceramic component is irradiated with a laser. The portion may correspond to a second region that is within the first region that is heated in operation 502. The second region may either be fully within or partially within the first region. The second region may also be described as being adjacent or proximate to the first region. The laser irradiation of operation 504 may heat the second region to a temperature that is greater than the elevated temperature of operation 502.

Operation 504 may be used to polish, strengthen, and/or repair the ceramic component. The laser irradiation may, for example, result in a reflowing of the ceramic material within the second region to form a polished surface on the component. In some cases, the polished surface has a surface roughness that is reduced or smoothed as compared to an untreated surface. In some implementations, the ceramic component is formed from sapphire having a single-crystal structure. The second region may include a discontinuity in the single-crystal structure, and the irradiation operation 504 may realign the single-crystal structure to repair the discontinuity.

Similar to the examples provided above with respect to process 400, the laser polishing may be performed on a non-planar or otherwise contoured region of the ceramic component. With reference to FIGS. 3A-3C, the contoured region may include a recess or opening formed in a surface of the sapphire component. In particular, the contoured region may include a groove 112, speaker opening 114, button opening 116, or other similar feature formed into the cover sheet 110. The contoured region may also include an edge of an opening or edge of another feature formed in the sapphire component. In particular, the contoured region may include the chamfer 117, contoured edge 118, or other similar feature formed into the cover sheet 110. Also similar to previous examples, the laser polishing of operation 504 may be combined with an abrasive polishing operation which may be used to produce a flat polished region on planar surfaces of the component. The laser polishing of operation 504 may result in a surface finish that is substantially matched to the surface finish on other regions of the component resulting from an abrasive polishing operation.

In some embodiments, the laser is configured to deliver a laser beam having a spot size that ranges between 0.1 $mm^2$ and 1 $cm^2$; a wavelength that ranges between 200 nm to 10 µm; a pulse duration that ranges between a femtosecond to multiple microseconds; and a pulse repetition rate that ranges between 100 Hz and 500 KHz. The example ranges are provided as illustrative examples and are not intended to be limiting in nature. In some embodiments, operation 502 is performed using a first laser-based process and operation 504 is performed using a second, different laser-based process.

Additionally or alternatively, the irradiation operation 504 may be used to perform a polishing operation by ablating the surface of the ceramic component. Similar to the example provided with respect to operation 404, short laser pulses may be used to ablate multiple small regions that are proximate to each other to produce a polished surface.

In some implementations, operation 504 is performed before the first region of the ceramic component cools below the first temperature (e.g., while the component is being heated or has been heated as a result of operation 502). Because the temperature of the localized area is increased or elevated due to operation 502, the temperature gradient(s) within the component may be reduced as compared to a laser-polishing operation. Accordingly, the risk of fracturing or otherwise damaging the ceramic component may be reduced while performing the laser-based polishing operation. In some implementations, the laser irradiation may also repair and/or strengthen the second region of the ceramic component by healing micro-cracks or realigning the crystalline structure of the material.

With respect to operation 504, the second or increased temperature may be above a threshold temperature. The threshold temperate may, for example, correspond to the brittle-ductile transformation temperature of the ceramic component. If the ceramic component is formed from a sapphire material, the brittle-ductile transformation may be at or around 1000 degrees Celsius. In some embodiments, the threshold temperature may be greater than 1500 degrees Celsius. In some embodiments, the threshold temperature may be at or above a melting point of the ceramic component, which for sapphire components may be between 2000 to 2100 degrees Celsius.

In some embodiments, the difference between the first elevated temperature of operation 502 and the second increased temperature of operation 504 is less than a maximum temperature gradient. In particular, the maximum temperature gradient may correspond to a temperature gradient that presents an unacceptable risk that the sapphire part will crack, break, or otherwise be damaged as a result of thermal stress. The maximum temperature gradient may correspond, for example, to a maximum amount of thermal expansion that can incur without producing an internal slip line or fracture within a crystalline structure. In some embodiments, the maximum temperature gradient may be less than 100, 500, or 1000 degrees Celsius.

In some embodiments, after the component is heated in operation 502, and after the localized heat treatment is performed at operation 504, the part may be cooled. In some embodiments, the component is cooled at a particular cooling rate (e.g., at or below 0.25° C. per minute, 0.5° C. per minute, 1° C. per minute, 3° C. per minute, 6° C. per minute, etc.). If the ceramic component is cooled too rapidly, it may negatively affect the component, for example, by causing too rapid of a recrystallization, causing the component to break or causing micro cracks or other defects. In some embodiments, the component is cooled according to a multi-step cooling profile (e.g., cool to 1000° C. at 3° C. per minute, then cool from 1000° C. to 20° C. at 6° C. per minute, etc.).

Figure 6:
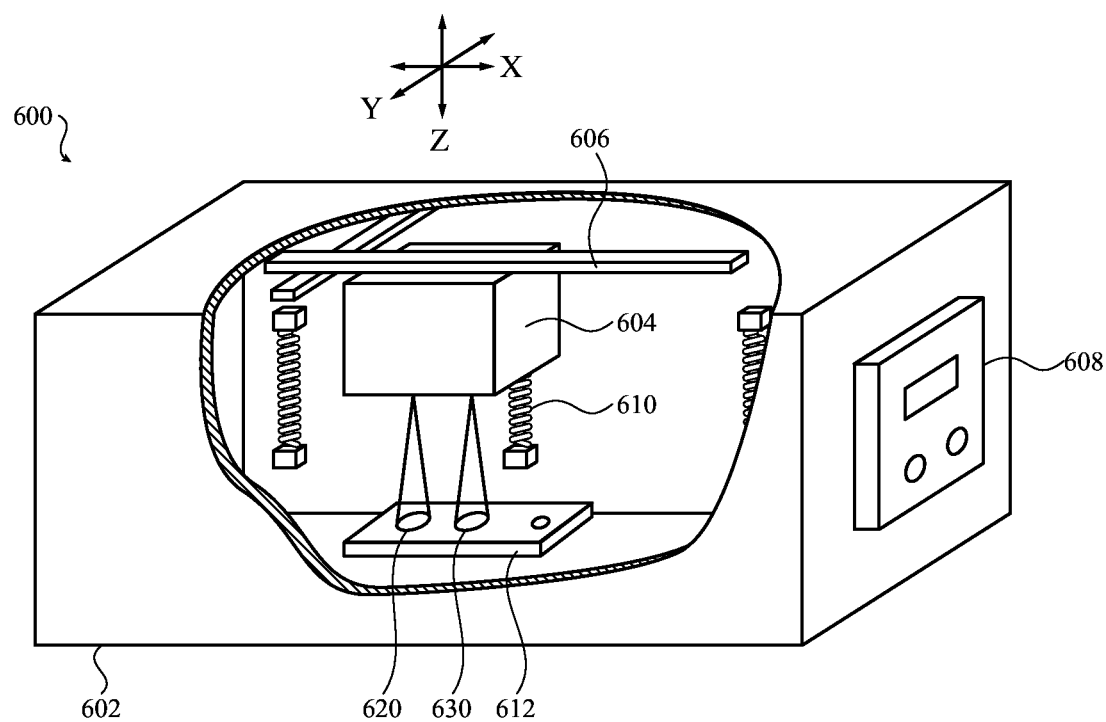
FIG. 6 depicts a schematic view of an exemplary system for polishing a sapphire component.

FIG. 6 depicts a schematic representation of an example system 600 that can be used to polish a ceramic component in accordance with the embodiments described herein. In particular, the system 600 can be used to polish and/or strengthen a ceramic component, such as a sapphire cover sheet, in accordance with processes described above with respect to FIGS. 4 and 5.

FIG. 6 depicts various aspects of system 600 that can be used together or separately to polish, strengthen, and/or repair a ceramic component. In general, the system 600 includes a localized heating device 604 that may be used to generate heat over a localized region of a ceramic component. In the present example, the ceramic component is a sapphire component 612, which may correspond to any one of covers 110, 120, 130, 140 described above with respect to FIGS. 1A-3C. The localized heating device 604 may include a laser that is configured to irradiate a portion of the sapphire component 612 using beam 620 in order to melt, reflow, ablate, or otherwise produce a surface having a reduced roughness. The treated surface may be polished in accordance with the embodiments described herein.

The system 600 may optionally include other heating devices for increasing the temperature of the sapphire component 612 in order to reduce thermal gradients during a polishing or treating operation. Specifically, the system may include a heating device 602 which may include a furnace or heating chamber for heating the sapphire component 612. The heating device 602 may include one or more heating elements 610 for increasing the temperature within an internal volume of the heating device 602, and thus heating the sapphire component 612.

Additionally or alternatively, the localized heating device 604 of system 600 may be configured to produce a second beam 630 that is configured to heat a region of the sapphire component 612. The second beam 630 may be configured to produce an elevated temperature that is lower than the treatment temperature produced using beam 620 in order to reduce thermal gradients during the polishing or treatment process. In some embodiments, the second beam 630 is produced using the same laser used to produce first beam 620, but configured to vary the one or more laser parameters (power, pulse duration, spot size, wavelength, etc.).

While FIG. 6 depicts the sapphire component 612 located within the heating device 602 and also being treated with a localized heating device 604, the two operations may not be performed at the same time and/or at the same place. For example, the sapphire component 612 may be heated using the heating device 602 and then removed before subjecting the component to the localized heating device 604.

The system 600 also includes a controller 608 used to control the heating device 602 and/or the localized heating device 604. In the present embodiment, the controller 608 includes a computer processor (e.g., a microcontroller) and computer memory for storing computer-readable instructions. The computer-readable instructions may be executed on the computer processor causing the system 600 to perform one or more of the processes described herein. The controller 608 also includes an input/output (I/O) for communicating with other elements of the system 600, including the heating device 602 and localized heating device 604. While a single controller 608 is depicted, the system 600 may include multiple, separate controllers.

The localized heating device 604 may include or be mounted to a positioning mechanism that enables the localized heating device 604 to apply heat treatment to different regions of the sapphire component 612 being treated. The localized heating device 604 may include a laser or laser-directing optic that is mounted to an x-y or x-y-z gantry positioner 606. The gantry positioner 606 may include a fixture that is configured to move a laser or laser-directing optic along one or more axes by motors, actuators, or the like. Additionally or alternatively, the system 600 may include one or more goniometers or other beam-directing mechanisms for directing the laser beams 620 and 630 onto the sapphire component 612.

Operation of the system 600 may be provided as a computer program product, or software, that may include, for example, a computer-readable storage medium or a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

While any methods disclosed herein have been described and shown with reference to particular operations performed in a particular order, it will be understood that these operations may be combined, sub-divided, or re-ordered to form equivalent methods without departing from the teachings of the present disclosure. Accordingly, unless specifically indicated herein, the order and grouping of the operations are not a limitation of the present disclosure.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular embodiments. Functionality may be separated or combined in procedures differently in various embodiments of the disclosure or described with different terminology. These and other variations, modifications, additions, and improvements may fall within the scope of the disclosure as defined in the claims that follow.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method of at least one of moving or removing a surface defined by a bulk ceramic material of a component, the method comprising:
    heating a first region of the surface to a first temperature;
    irradiating a second region of the surface, the second region being a contoured region within the first region, using a laser to heat the second region to a second temperature that is at least near a melting temperature of the bulk ceramic material and is greater than the first temperature; and
    reflowing the bulk ceramic material defining the surface within the second region to reduce a surface roughness of the surface while maintaining a constant overall geometry of the second region.

2. The method of claim 1, wherein heating the first region comprises:
    placing the component within a furnace; and
    heating the furnace to heat the first region of the surface of the component to an elevated temperature; and
    wherein irradiating the second region occurs before the first region cools below the first temperature.

3. The method of claim 1, wherein:
    heating the first region comprises:
        irradiating the first region using a first laser-based process to heat the surface of the component to an elevated temperature, which is different from a second laser-based process used to irradiate the second region; and
    before the first region cools below the first temperature, the second region is irradiated using the second laser-based process.

4. The method of claim 1, wherein:
    the first temperature is less than an annealing temperature of the bulk ceramic material; and
    the second temperature is greater than a melting temperature of the bulk ceramic material.

5. The method of claim 1, wherein:
    the first temperature is less than 1400 degrees Celsius; and
    the second temperature is greater than 1500 degrees Celsius.

6. The method of claim 1, wherein: the bulk ceramic material comprises sapphire; the sapphire has a single-crystal structure; the second region includes a discontinuity in the single-crystal structure; and irradiating the second region realigns the single-crystal structure to repair the discontinuity.

7. A method of at least one of moving or removing a non-planar surface defined by a bulk ceramic material of a component, the method comprising:
    heating the non-planar surface to a first temperature;
    irradiating a contoured region of the non-planar surface using a laser to a second temperature that is at least near a melting temperature of the bulk ceramic material;
    reflowing at least a portion of the bulk ceramic material defining the contoured region of the non-planar surface to produce a polished contoured region on the non-planar surface while maintaining a constant overall geometry of the contoured region; and
    polishing a planar surface adjacent to the non-planar surface using an abrasive polishing operation.

8. The method of claim 7, wherein the contoured region of the non-planar surface is at least part of a groove defined by the component.

9. The method of claim 7, wherein the contoured region of the non-planar surface is a side wall of an opening defined by the component.

10. The method of claim 7, wherein a surface finish of the polished contoured region of the non-planar surface is substantially the same as a surface finish of a flat polished region of the ceramic component.

11. A method of at least one of moving or removing a surface defined by a bulk ceramic material of a component and having a contoured region that is adjacent to a planar region, the method comprising:

polishing the planar region to produce a polished face;
heating the contoured region to a first temperature; and
irradiating the contoured region using a laser to heat the bulk ceramic material defining the contoured region to a second temperature at least near a melting point of the bulk ceramic material, wherein:
heating and irradiating the contoured region reduces a surface roughness of the contoured region without altering a surface finish of the polished face or an overall geometry of the contoured region.

12. The method of claim 11, wherein the second temperature is greater than 1700 degrees Celsius.

13. The method of claim 11, wherein the planar region is a portion of a cover sheet to be disposed above a display of a portable electronic device.

14. The method of claim 11, wherein the contoured region includes a recess defined by the component.

15. The method of claim 11, wherein the contoured region includes an edge of an opening defined by the component.

16. The method of claim 11, wherein polishing the planar region is performed using one or more of:
a mechanical polishing operation; and
a chemical mechanical polishing operation.

17. A method of at least one of moving or removing a surface defined by a bulk ceramic material of a component, comprising:
irradiating the surface using a laser to remove bulk ceramic material therefrom and form a first ablated region;
irradiating the surface using the laser to remove bulk ceramic material therefrom and form a second ablated region proximate the first ablated region; and
irradiating the surface using the laser to remove bulk ceramic material therefrom and form a third ablated region proximate the second ablated region, wherein the first, second and third ablated regions are part of a polished surface having a decreased roughness as compared to the surface before irradiation using the laser.

18. The method of claim 17, wherein:
the second ablated region is adjacent to or at least partially overlapping with the first ablated region; and
the third ablated region is adjacent to or at least partially overlapping with the third ablated region.

19. The method of claim 17, wherein forming the first, second, and third ablated regions removes surface discontinuities in the bulk ceramic material.

20. The method of claim 17, wherein the polished surface is an edge of an opening defined by the component.

21. The method of claim 1, wherein the bulk ceramic material comprises sapphire.

\* \* \* \* \*